United States Patent
Meyer-Roscher et al.

(10) Patent No.: US 6,242,504 B1
(45) Date of Patent: Jun. 5, 2001

(54) CROSSLINKING OF RADIATION-CROSSLINKABLE PRESSURE-SENSITIVE ADHESIVE FILMS

(75) Inventors: Bernd Meyer-Roscher, Neustadt; Wolfgang Schrof, Neuleiningen; Dieter Urban, Speyer; Paul Ludwig Geiss, Idar-Oberstein; Walter Brockmann, Kaiserslautern, all of (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 09/157,592

(22) Filed: Sep. 21, 1998

(30) Foreign Application Priority Data

Sep. 29, 1997 (DE) .............................. 197 43 014

(51) Int. Cl.⁷ ............................... C08F 2/46; C08J 7/04; B13B 31/00; B32B 31/26
(52) U.S. Cl. ................... 522/2; 522/3; 522/181; 522/120; 522/121; 522/910; 427/516; 427/517; 427/513; 427/208.4; 427/508; 427/496; 427/505; 428/333; 428/332; 428/339; 428/343; 156/60; 156/272.2; 156/275.1; 156/275.3; 156/307.1; 156/325; 156/332
(58) Field of Search ................... 522/910, 3, 2, 522/181, 121, 120; 427/516, 517, 513, 208.4, 508, 496, 505; 428/333, 332, 339, 343; 156/60, 272.2, 275.1, 275.3, 307.1, 325, 332

(56) References Cited

U.S. PATENT DOCUMENTS

| 4,181,752 | * | 1/1980 | Martens et al. | 427/516 |
|---|---|---|---|---|
| 4,330,590 | * | 5/1982 | Vesley | 428/336 |
| 5,183,833 | * | 2/1993 | Fisher et al. | 522/182 |
| 5,504,391 | * | 4/1996 | Turner et al. | 313/570 |
| 5,891,530 | * | 4/1999 | Wright | 427/515 |
| 5,998,096 | * | 12/1999 | Umemoto et al. | 430/281.1 |

FOREIGN PATENT DOCUMENTS

| 96/00740 | * | 1/1996 | (WO) . |
| 97/39837 | * | 10/1997 | (WO) . |
| 97/400090 | * | 10/1997 | (WO) . |

OTHER PUBLICATIONS

Zhang et al. Modifiaction of polymers with UV excimer radiation from lasers and lamps. J. Adhesion Science and Technology. vol. 8, No. 10 pp. 1179–1210 (1994).*

The American Heritage Dictionary of the English Language, 3rd Ed. (1992).*

* cited by examiner

Primary Examiner—James J. Seidleck
Assistant Examiner—Sanza L. McClendon
(74) Attorney, Agent, or Firm—Keil & Weinkauf

(57) ABSTRACT

A description is given of a method of crosslinking radiation-crosslinkable pressure-sensitive adhesive films by controlled-dose exposure to actinic radiation, which involves exposing the film surface to a regular or irregular radiation pattern made up of regions of different intensity. The method permits a more precise adjustment of the adhesion—in particular, the adhesion of flexible films on a substrate.

10 Claims, 5 Drawing Sheets

CROSSLINKING OF RADIATION-CROSSLINKABLE PRESSURE-SENSITIVE ADHESIVE FILMS

The invention relates to a method of crosslinking pressure-sensitive adhesive films by controlled-dose irradiation, especially with UV light.

With conventional pressure-sensitive adhesives (PSAs) based on acrylate, SBC or NR [SBC=styrene block copolymers such as SIS (styrene-isoprene-styrene) or SBS (styrene-butadiene-styrene), or SBR (styrene-butadiene rubber); NR=nitrile rubber=butadiene-acrylonitrile rubber] applied as hotmelts, dispersions or in solvent, the PSA properties can be influenced by adding tackifiers. These include both tackifying resins and plasticizers, such as oils.

Modem PSAs are based on solvent-free hotmelt PSAs which are applied as a film to a substrate and then can be crosslinked by irradiation, especially with UV light. Adhesives of this kind have been described, for example, by Auchter, Barwich, Rehmer and Jäger in the article "UV-vernetzbare Acrylat-Schmelzhaftklebstoffe" [UV-crosslinkable acrylate hotmelt pressure-sensitive adhesives] in "kleben & dichten" 37 (1993), pages 14 to 20 and in EP-A 377 199 and 448 741. The base polymer is prepared in such a way that it is close to what is known as the gel point. The polymer is sensitized to high-energy radiation, especially UV-A radiation, with the aid of photoinitiators, which are either mixed in or attached chemically. Controlled exposure to a defined UV dose enables the degree of crosslinking of the polymer to be adjusted. It is this degree of crosslinking which is the critical determinant of the ultimate properties of the PSA. For instance, using a single polymer it is possible merely by irradiation with different UV doses to produce a very tacky adhesive label which adheres even to moist substrates or an adhesive label which has crosslinked so much that it can be redetached without residue from any surface.

Such ultimate properties can be adjusted in principle as described above. Irradiation is carried out solely with the level of UV light required to establish the desired properties. Otherwise, "overexposure" would drastically alter the properties of the product.

Optimum PSA properties, however, which are described by the tack, the peel resistance and the shear strength (holding power and shear adhesion failure temperature (SAFT)), are difficult to combine in a homogeneous PSA composition. High tack and peel resistance are associated with poor shear strength, and vice versa.

It is an object of the invention to exert a controlled influence over the properties of a radiation-crosslinkable PSA film in such a way as to obtain, overall, an optimum combination of the above-described properties.

We have found that this object is achieved by a method of crosslinking radiation-crosslinkable pressure-sensitive adhesive films by controlled-dose exposure to actinic radiation, which comprises exposing the film surface to a regular or irregular radiation pattern made up of regions of different intensity.

DETAILED DESCRIPTION OF THE INVENTION

Figure 1:
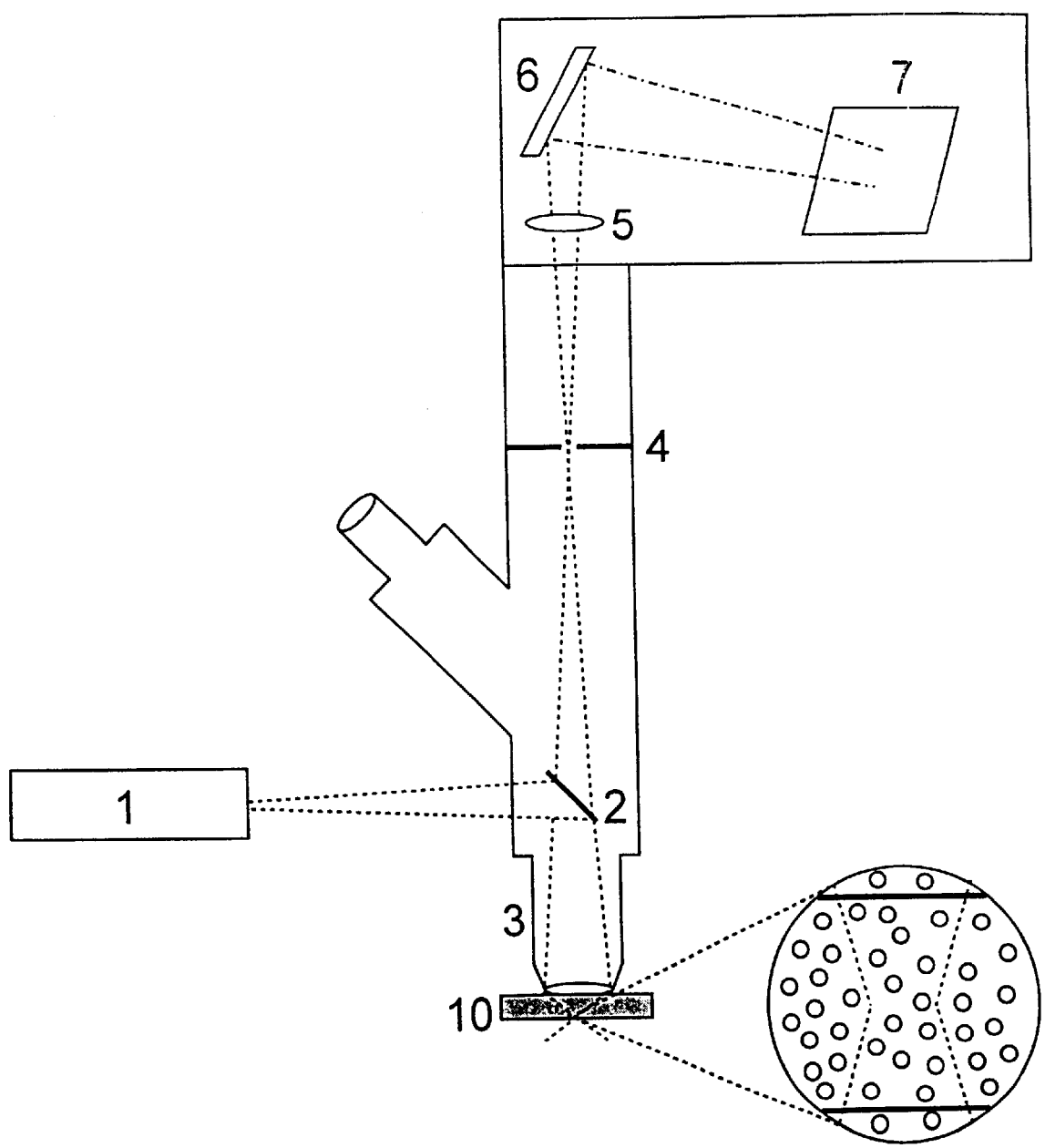
FIG. 1 shows the diagrammatic setup of an apparatus for using confocal Raman Spectroscopy to measure the degree of crosslinking.

In one embodiment of the method the radiation pattern consists of regions of finite intensity alongside radiationless regions.

Actinic radiation is, for the purposes of the present invention, any radiation that induces irreversible crosslinking in the crosslinkable film to be exposed to it. Particularly suitable forms are UV light, shortwave visible light, and electron beams.

The method of the invention expands the options for controlling the ultimate properties of radiation-crosslinkable, and especially UV-crosslinkable, PSAS: by means of spatially defined punctiform irradiation in the area of adhesion it is possible to produce, alongside one another, regions which vary in their degree of crosslinking, or completely uncrosslinked regions, in a film of a radiation-crosslinkable PSA composition.

This can be done by selectively irradiating the regions that are to be crosslinked, using, for example, UV rays or electron beams focused with optical or magnetic lenses, or by patterned irradiation with, for example, appropriate, temporally and spatially controlled laser light.

The same can also be achieved, however, by controlled shading of those regions of the PSA film that are to be crosslinked to a lesser degree, using masks, stencils or regions of dark or shade produced by means of interference phenomena. In a continuous processing operation the devices required for this either can travel with the backings in web form that are to be irradiated or can be mounted in fixed form and produce a spatially mobile pattern of shade or intensity.

Said options for spatially heterogeneous irradiation produce spatially heterogeneous crosslinking, which produces a pattern of crosslinking in the film of PSA composition. This crosslinking pattern may comprise regions which vary in their degree of crosslinking, distributed irregularly in a random fashion, or may be a regular, repeating pattern. In the pattern, the regions with a greater degree of crosslinking may be coherent and enclose insular regions of less highly crosslinked PSA composition, or vice versa.

The size of the insular regions can range from just a few nanometers to several centimeters, but is preferably within the order of magnitude of from 0.001 to 10 mm.

The area of the regions crosslinked to a greater or lesser extent, as a proportion of the total area of the PSA composition, can in each case vary between 2 and 98%. It is preferably between 10 and 90%.

Application of the method of the invention adds a further parameter, alongside the composition of the adhesive film and the intensity of irradiation, to those which can be used for exerting controlled influence over the adhesion properties, namely the two-dimensional structure (pattern) and the two-dimensional proportion (distribution) of regions which vary in their degree of crosslinking.

In particular, less highly crosslinked regions may contribute to an improvement in the tack of the irradiated material. Although these less highly crosslinked regions are only of low shear strength, they can be supported, and so secured against shearing or flow under load, by a surrounding pattern of more highly crosslinked regions.

This makes it possible to produce new kinds of products with self-adhesive PSA compositions crosslinkable by UV radiation or electron beams, said products being superior in their combination of tack and shear strength to the products available at present.

Alternatively, by an appropriate choice of the irradiation parameters, the proportions and the properties of the regions with greater and with lesser degrees of crosslinking can be chosen so as to give an adhesive strip that can be detached easily and virtually without residue. This is achieved in particular by exposing the entire area of adhesive to crosslinking irradiation and, in doing so, by crosslinking certain regions to such a high extent that they are virtually deactivated in terms of tack.

In connection with the production of packing tapes, applying the spatially selective crosslinking of the adhesive film can result in a reduction in the noise produced when the packing tape is being unwound from the roll, so reducing the perceived noise nuisance in goods dispatch areas to a tolerable level.

A further application arises from the possibility of having uncrosslinked regions of the adhesive film separate cohesively (i.e., with stringing and separation in the adhesive composition itself, leaving residues of adhesive on both the backing of the adhesive strip and the bonded surface) and more highly crosslinked regions of the adhesive film separate adhesively (i.e., virtually without residue as far as the bonded surface is concerned) on removal. If the uncrosslinked regions of the adhesive form a pattern or indicia, then an attempt to remove the adhesive strip so produced leaves clear marks in the surface of the adhesive strip and of the bonded surface which evidence the attempt at removal; accordingly, an adhesive strip produced in this way can be used as a closure in the manner of a seal or can be employed in the field of security labeling.

The degree of crosslinking of the PSA films employed in the method of the invention is in general determined by absorption measurement on the irradiated film. Said film preferably includes polymerizable or crosslinkable compounds together with crosslinking or polymerization initiators, which are activated by actinic radiation and transformed by their participation in the reaction. Normally, their absorption changes in the process, so that measuring the absorption can be used to determine the degree of reaction.

The absorption measurement preferably takes place in accordance with the process described in the earlier but not prior-published German Patent Application 197 07 967.9, by confocal Raman spectroscopy or confocal fluorescence spectroscopy.

Within the PSA film the photoinitiators are attached to the crosslinkable compounds preferably by chemical means—for example, by covalent bonds. Conventionally, suitable photoinitiators are all compounds which are able by irradiation with UV light to undergo the transition to an excited state in which they have the capacity to react with the crosslinkable compounds. Compounds found particularly suitable for this purpose are aromatic carbonyl compounds, especially benzophenone, its derivatives and substitution products—referred to here collectively as benzophenone compounds. In the way in which it is understood at present, crosslinking here involves the reaction of radiation-activated carbonyl groups to form a benzhydrol crosslinking structure as described in the article referred to earlier.

In the course of the reaction, the benzophenone radicals are consumed by reaction; in other words, characteristic bands in the spectrum disappear.

Particularly suitable crosslinkable compounds are polymers and oligomers of (meth)acrylates. Suitable compounds are described, inter alia, in EP-A 448 741. These are copolymers of (meth)acrylic acid derivatives substituted by phenone radicals, especially benzophenone radicals, with unsubstituted (meth)acrylates.

The crosslinkable compositions can, generally, be processed as melts, as solutions or as dispersions. They are particularly suitable for the production of PSAs, PSA films and PSA labels, and of stamping films. In these applications the compositions can be applied conventionally, at elevated temperature if desired—for instance, at from 20 to 150° C.—to customary substrates, such as paper, card, wood, metals and plastic films composed, for example, of plasticized PVC, polyethylene, polyamides, polyesters or polypropylene.

The undried, dried or part-dried films are subsequently crosslinked by irradiation with UV light to give coatings which adhere well and combine a high level of cohesion and good peel strength with excellent ageing stability. Irradiation need not be conducted under an inert gas atmosphere; instead, air operation is possible. The UV emitters which can be employed are the usual candidates, examples being low, medium and high pressure mercury vapor lamps. In some cases, the IR fraction emitted by the lamps in the course of crosslinking irradiation may remove residual solvent or water at the same time.

The degree of crosslinking of the crosslinked PSA films is determined by means of Raman or fluorescence spectroscopy, using the intensity of characteristic spectral bands to indicate the degree of reaction of the photoinitiator.

Through the analysis of molecular vibrations, Raman spectroscopy permits chemical identification in a manner similar to that of the widespread infrared spectroscopy.

Confocal Raman microscopy combines the chemical structural information of Raman spectroscopy with the high local resolution of confocal optical microscopy, of about 1 $\mu m^3$ (see FIG. 1). The setup links a confocal microscope with a Raman spectrometer in such a way that a laser is focused onto a very small measurement volume by the imaging optics of the microscope. The Raman light produced is first separated spectrally from the laser light in the detection beam path (for example, by way of a holographic notch filter). A confocal diaphragm in the detection beam path selects the depth level and thus delimits the measurement volume three-dimensionally to a few $\mu m^3$. A simple grating spectrograph of high light power is able to take over the spectral dispersion of the Raman light. Detection is by means, for example, of a two-dimensional CCD chip.

As well as the surface imaging of chemical structures it is also possible to obtain depth profiles with Am resolution. In the majority of cases, complex sample preparation and doping with labeling substances are unnecessary.

This measurement technique makes it possible to detect with precision the degree of crosslinking of a PSA, which is responsible for the ultimate properties.

The technique exploits the fact that the photoinitiator is chemically altered during UV exposure. This reaction can be monitored with great exactitude by the decrease in the characteristic Raman or fluorescent bands and gives information about the crosslinking. In particular, it is also possible to determine whether the photoinitiator has been used up completely and, consequently, whether there is any risk of UV aftercuring which might alter the adhesion.

As well as achieving the objectives set out above, confocal Raman or fluorescence spectroscopy can be used for the quality control of PSA products. This embraces quality control both in the production of the adhesive and in connection with the crosslinked adhesive film.

An apparatus for conducting the measurement technique described above is described below with reference to FIG. 1. This figure shows the diagrammatic setup of an apparatus for using confocal Raman spectroscopy to measure the degree of crosslinking.

The apparatus of FIG. 1 is based essentially on a combination of a confocal microscope having a laser light source with a Raman spectrometer. The exciting light from a laser light source 1 is here diverted by a notch filter 2 so that it passes via the objective 3 of the microscope into the sample 10 under investigation. A notch filter is particularly suitable for deflection because it reflects almost completely a particular laser wavelength. It is also possible, however, to use conventional mirror arrangements. The objective 3 defines the cross section of the observation volume in the sample 10, since it focuses the exciting light from the laser 1 and then the resulting cone of light limits the propagation of the laser light in the sample vertically to the direction of incidence. The laser light nonelastically scattered in the sample 10 is picked up from the sample by way of the objective 3 and, with the exciting light reflected from the sample 10 in this case being filtered out by way of the notch filter 2, is passed to a confocal diaphragm 4. This diaphragm 4, through its exclusion effect, selects the depth definition of the observation volume in the sample 10, i.e., its position in the sample in the direction of incidence of the exciting light. After the diaphragm 4 the Raman scattered light passes through a lens 5 to a grating spectrograph 6, which carries out spectral dispersion of the scattered light.

The individual spectral lines are then passed to a two-dimensional CCD chip 7 as photodetector, which is used to measure the band intensity. Different depths can be established by changing the distance between sample and objective.

With an analogous setup of the measurement apparatus it is also possible to determine the depth-resolved degree of crosslinking of PSA films by confocal fluorescence spectroscopy. For this purpose, the light source in the apparatus according to FIG. 1 is judiciously a UV light source and a cutoff filter is advantageously used in place of the notch filter 2. Evaluation of the fluorescence emission spectrum of the sample can be made conventionally in analogy to the above-described Raman spectroscopy.

The adhesive properties of two-dimensional substrates having a PSA film can be detected by measuring the shear strength, as a measure of the cohesion, and the peel strength, as a comprehensive measure of cohesion and adhesion. For the purposes of testing, polyethylene terephthalate or aluminum sheets are coated with a PSA film so as to give a dry film thickness of from 25 to 80 $\mu$m.

For the testing of solvent-free hotmelt PSAs, polyethylene terephthalate sheets are coated with the PSA compositions on a heated coating bench at from 85 to 120° C. to give a film thickness of about 25 $\mu$m.

Where copolymer solutions are employed for the test, the solvents are evaporated off at 70° C. and 1 bar for 1 minute. The coated and dried sheets are irradiated with the light from medium pressure mercury lamps.

Irradiation takes place with one or more medium pressure mercury lamps arranged in series, each with an output of from 80 to 160 watts per cm of beam length. The coated and dried sheets are placed on a continuous moving belt, so that the coated sheets pass below the lamps at a distance of from 5 to 50 cm and at a speed of from 6 to 20 m/min. Irradiation takes place in air.

The sheets produced in this way are cut into strips 2.5 cm wide, and these strips are rolled onto an aluminum panel using a rubber-lined steel roller. The plate together with the strips is stored at 23° C. and 65% relative atmospheric humidity for 24 h.

To measure the peel strength, the test strips are peeled off backward parallel to the adhesive film at a speed of 100 mm per minute. The force required to do this is measured.

To measure the initial adhesion (tack) an adhesive strip 2.5 cm wide and 150 mm long is shaped into a loop and the two ends of the adhesive strip are clamped into the jaws of a tensile tester. The adhesive strip loop is brought into contact with a stainless steel or aluminum test plate and the adhesive tape is peeled off immediately at a speed of 300 mm per minute. The force required to peel the strip from the steel plate is measured. The mean of 6 measurements is formed.

In the measurement of the shear strength, a 25 mm wide substrate strip, coated with adhesive and irradiated in the manner described, is bonded over a length of 25 mm with a glass or stainless steel test plate which is at an inclination of 3° to the vertical. The inclination of the plate ensures that no peeling forces act on the bond. The overhanging part of the adhesive strip is loaded with a weight of 1 kg. The loaded sample is subsequently held at room temperature for 5 hours and then heated at a rate of 2° C. per hour. A note is taken of the time and temperature at which the bond fails. Throughout the test the temperature of the sample, in ° C., and the deformation of the sample (creep path), in $\mu$m, are measured.

The parts and percentages stated in the examples below are by weight. The K values are determined in accordance with DIN 53726 in 1% strength solution in tetrahydrofuran at 25° C. The melt viscosities are measured with a cone-plate rheometer; for example, the Rotovisko® RV 20 with measurement device PK 100 (from Haake, Karlsruhe) (D=shear rate in $s^{-1}$).

The Staudinger index (viscosity number) is determined in tetrahydrofuran at 25° C. by known methods (e.g., G. V. Schulz, H. -J. Cantow in Houben-Weyl, Methoden der organischen Chemie, G. Thieme Verlag, 1955, Vol. 3/1 pages 431 to 445 and B. Vollmert, Grundriss der makromolekularen Chemie, Volume III, page 55 ff).

EXAMPLE 1

Copolymer Solution P1

To a mixture of
160 g of ethyl acetate,
50 g of tetrahydrofuran and
9 g of tert-butyl peroxy-2-ethylhexanoate
there were added 150 g of a monomer mixture composed of
500 g of isoamyl acrylate,
300 g of 2-ethylhexyl acrylate,
170 g of methyl acrylate,
30 g of acrylic acid and
7.5 g of a benzophenone derivative of the formula

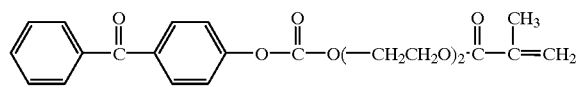

The mixture was polymerized at 85° C. for 15 minutes. Over the course of 2 hours, the remainder of the monomer mixture and, simultaneously but spread over 3 hours, a solution of 5 g of tert-butyl peroxy-2-ethylhexanoate in 40 g of ethyl acetate were added to the reaction mixture. After the end of the addition, polymerization was continued for 5 hours.

A copolymer was obtained which had a K value of 38.5 and a Staudinger index (viscosity number) of 0.39. When free from solvent and volatile fractions, the copolymer P1 has a melt viscosity of 15 Pa·s (D=100 s$^{-1}$) at 120° C.

EXAMPLE 2
Copolymer Solution P2
To a mixture of
160 g of ethyl acetate,
50 g of tetrahydrofuran and
10 g of tert-butyl peroxy-2-ethylhexanoate
there were added 150 g of a monomer mixture composed of
  500 g of n-butyl acrylate,
  330 g of 2-ethylhexyl acrylate,
  150 g of methyl methacrylate,
  20 g of acrylic acid and
  6.5 g of a benzophenone derivative of the formula

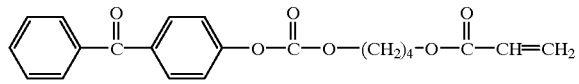

The mixture was polymerized at 80° C. for 15 minutes. Over the course of 2 hours, the remainder of the monomer mixture and, simultaneously but spread over 3 hours, a solution of 5 g of tert-butyl peroxy-2-ethylhexanoate in 40 g of ethyl acetate were added to the reaction mixture. After the end of the addition, polymerization was continued for 5 hours.

A copolymer was obtained which had a K value of 48 and a Staudinger index of 0.41. When free from solvent and volatile fractions, the copolymer P2 has a melt viscosity of 40 Pa·s (D=200 s$^{-1}$) at 120° C.

EXAMPLE 3
Copolymer Solution P3
To a mixture of 280 g of a petroleum spirit, low in n-hexane, with a boiling range of 60 to 95° C. and 70 mg of 2,2'-azobisisobutyronitrile there were added 270 g of a monomer mixture composed of
870 g of 2-ethylhexyl acrylate,
100 g of methyl methacrylate,
30 g of acrylic acid and
2.0 g of the benzophenone derivative of the formula

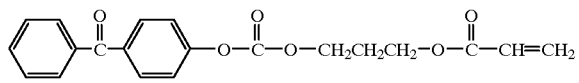

The reaction mixture was initially polymerized at reflux temperature for 15 minutes. Then the remainder of the monomer mixture was added over the course of two hours and, after the end of the addition, the reaction mixture was held under gentle reflux for a further two hours. Subsequently, 10% by weight of a solution of 10 g of tert-butyl peroxypivalate in 50 g of petroleum spirit, low in n-hexane, with a boiling range of 60 to 95° C. was added to the mixture over the course of 5 minutes. One hour later the remainder of this solution was added, together with 670 g of the same petroleum spirit.

This gave the solution of a copolymer P3 having a K value of 68.

EXAMPLE 4
Copolymer P4
The procedure described for copolymer P2 was repeated but using, for the polymerization, a solution of
800 g of isoamyl acrylate,
180 g of vinyl acetate,
20 g of methacrylic acid and
7.0 g of the benzophenone derivative of the formula

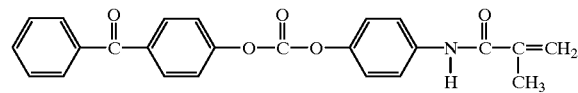

This gave a copolymer having a K value of 36.

EXAMPLE 5
Copolymer P5
The procedure described for copolymer P2 was repeated but using, for the polymerization, a solution of
900 g of isoamyl acrylate,
100 g of Macromer® 13 K-RC (styrene oligomer having a methacrylate end group; manufacturer Sartomer Inc.) and
6.5 g of the benzophenone derivative of the formula

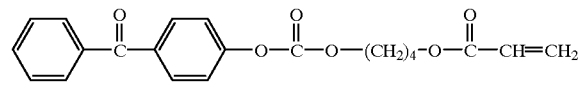

This gave a copolymer having a K value of 45.
Examples of Suitable Patterns
The table below indicates the typical properties of some patterns with individual circular areas which can be produced on the adhesive strip by irradiation through a mask or by one of the other methods cited. The patterns were produced using the polymer solution P2. Similar results were obtained with the other polymer solutions.

| Pattern No. | Dot diameter [mm] | % coherent area | Dot spacing in the x direction | Dot spacing in the y direction | Angle between adjacent dots [°] |
|---|---|---|---|---|---|
| 1 | 1.2 | 42 | 1.7 | 3.2 | 60 |
| 2 | 1.5 | 22 | 4 | 4 | 45 |
| 3 | 1.7 | 45 | 2.4 | 4.1 | 60 |
| 4 | 2 | 47 | 2.8 | 4.8 | 60 |
| 5 | 3 | 33 | 5 | 8.7 | 60 |
| 6 | 4.8 | 50 | 6.5 | 11.2 | 60 |

Figure 2:
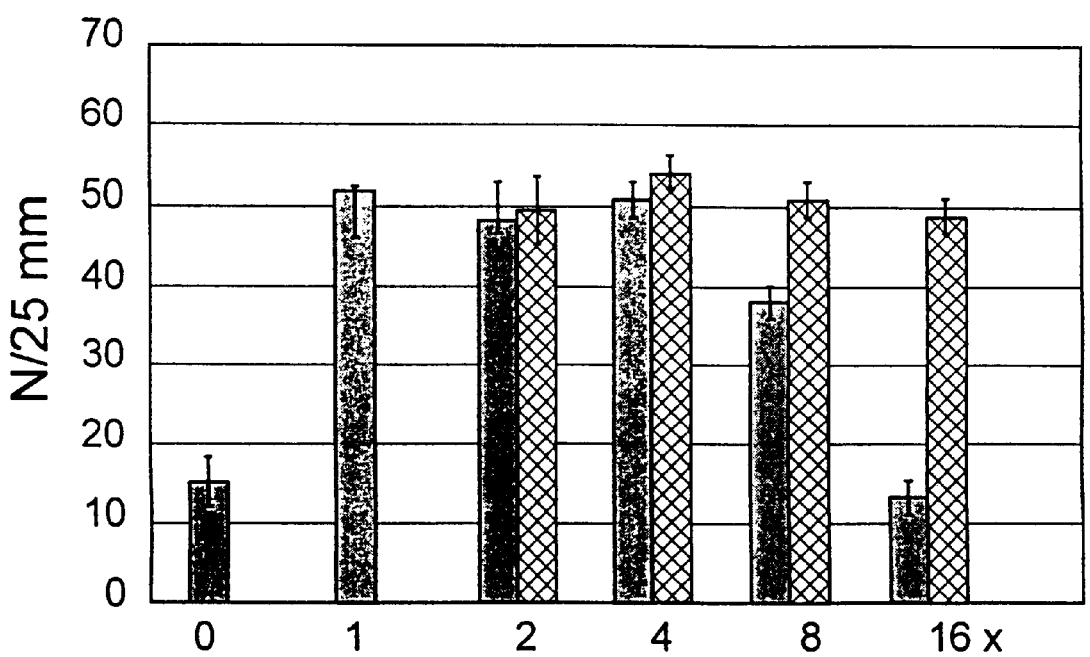
FIG. 2 shows the testing of peel strength.

Results of Testing the PSA Properties
The testing of peel strength is shown in FIG. 2.
The abscissa (x-axis) indicates the number of passes under the irradiation nit at a lamp output of 160 W/cm, a distance of 10 cm and a speed of 10 cm/s. The ordinate (y-axis) indicates the peel force in N/25 mm sample width.
The non-hatched columns (on the left-hand side of the figure for each of the multiple passes) indicate the peel forces following irradiation without a mask; the columns depicted with regularly spaced dots (in each case on the right-hand side of the figure) indicate the peel forces following irradiation beneath a perforated mask with pattern 5 at a distance of 3 mm from the surface of the adhesive.

The homogeneously irradiated adhesive strips exhibit low peel values with cohesive failure in the uncrosslinked state. After 2 to 4 passes, the peel values pass through a maximum with hybrid failure (part cohesive, part adhesive), and after 8 irradiation cycles the adhesion properties have been reduced to such an extent that there is a very sharp fall in the peel values accompanied by solely adhesive failure. When the perforated mask was used, the adhesive strips were in fact passed once through the unit without a mask in order to produce a homogeneous crosslinking base.

The drop in peel values on multiple passage through the UV unit is sharply reduced, as shown by FIG. 2.

Figure 3:
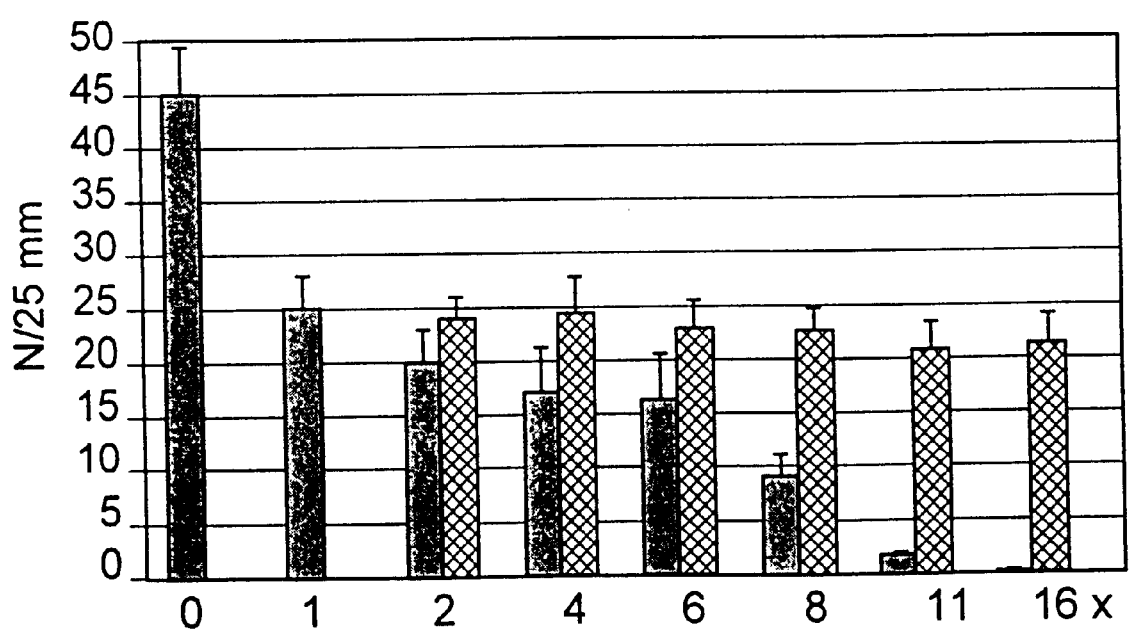
FIG. 3 shows the initial adhesion (tack).

The initial adhesion (tack) is shown in FIG. 3.

The grey dotted areas indicate the tack following irradiation without a mask; the dark areas that following irradiation through mask No. 5. It is clear from this that following two cycles of homogeneous irradiation (without a mask) with the same settings as for the peel strength test, the tack is greatly reduced and, after 8 passes, it disappears almost completely.

With the patterned irradiation, the tack is retained even after 8 passes. Initial homogeneous irradiation was performed as described above by means of one pass beneath the UV source.

Figure 4:
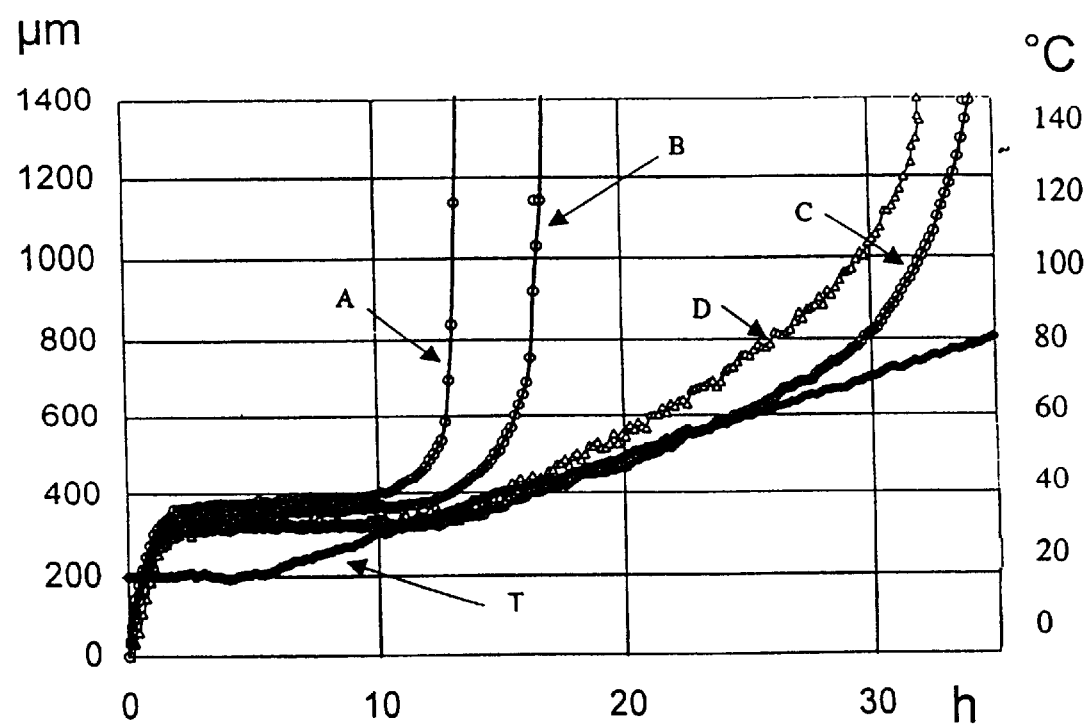
FIG. 4 shows the shear strenth.

The shear strength is depicted in FIG. 4.

The abscissa indicates the time in hours, while the ordinate indicates on he left-hand side the shear path in μm for plots A to D and on the right-hand side the temperature in ° C. for the plot T. Plot A shows the behavior following twofold UV irradiation without a mask, plot B that after fourfold and plot C that after eightfold irradiation without a mask. Plot D shows the behavior following a single homogeneous UV irradiation and sevenfold UV irradiation under mask No. 5. The plot T indicates the temperature, in ° C., which was reached when the samples were heated, in each case at the time shown on the abscissa.

The measurements show that the adhesive strips irradiated homogeneously twice (plot A) have only a low shear strength and fail after just 12 hours at 37° C. Fourfold (plot B) and eightfold (plot C) irradiation increases the service life to 16 and 34 hours and the failure temperature to 44 and 78° C., respectively.

Comparison of a homogeneously crosslinked adhesive strip (plot C) with a sample produced by single homogeneous UV irradiation and then spatially selective mask irradiation (plot D) at a mask distance of 3 mm in 7 passes shows only a slight difference in terms of the shear strength. The properties of tack and peel strength, however, as shown above, are not lost, in contradistinction to the adhesive strip which was subjected to eightfold homogeneous irradiation. This illustrates the decisive advantage of the method.

Figure 5:
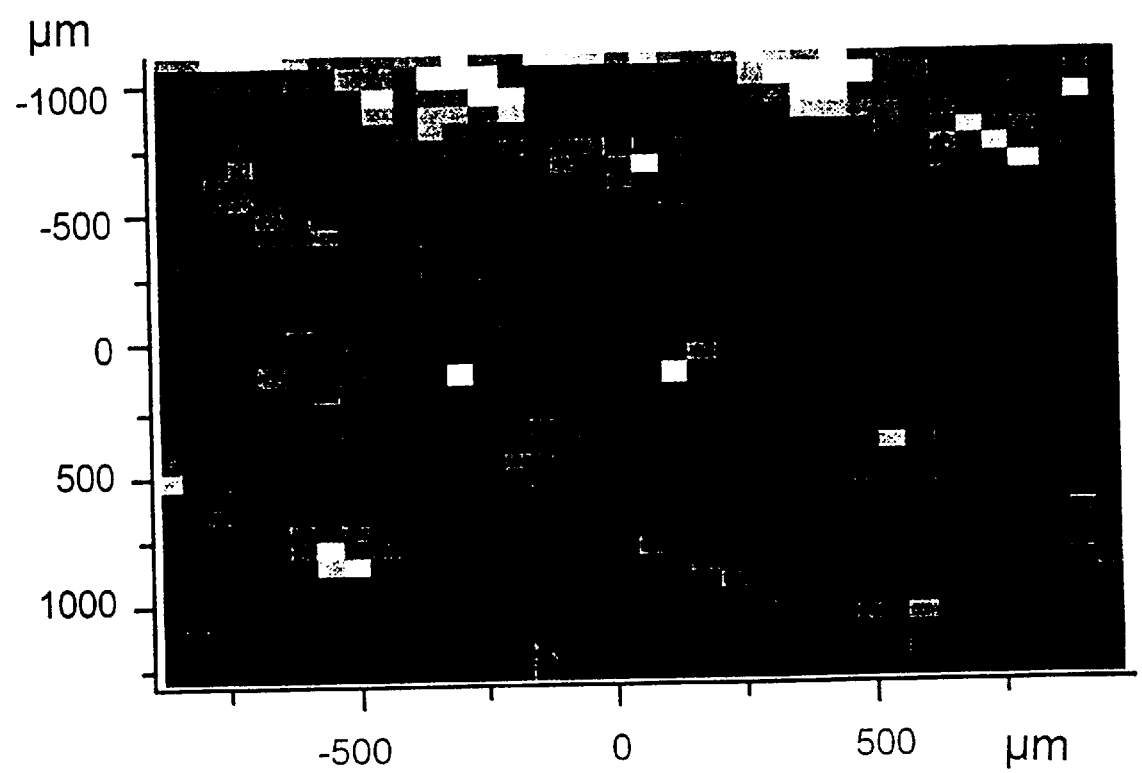
FIG. 5 is a representation obtained by computer tomography of one region of the surface of of PSA film crosslinked by means of UV radiation.

FIG. 5 is a representation obtained by computer tomography of one region of the surface of a PSA film crosslinked by means of UV radiation beneath a perforated mask having circular perforations with a diameter of 0.35 mm. To obtain this representation the surface was scanned line by line with laser light and for each point the intensity of the resulting Raman scattered light was measured. The absorption values obtained by confocal Raman spectroscopy, as a measure of the degree of crosslinking, are shown in the figure as different grey stages. These illustrate the crosslinking pattern obtained.

We claim:

1. A method of crosslinking radiation-crosslinkable pressure-sensitive adhesive films by controlled-dose exposure to actinic radiation, which comprises exposing the film surface to a regular or irregular radiation pattern made up of regions of different intensity.

2. The method of claim 1, wherein the pattern consists of regions of finite intensity alongside radiationless regions.

3. The method of claim 1, wherein the actinic radiation employed is UV light or electron beams.

4. The method of claim 1, wherein the radiation pattern is generated by focusing the radiation using lenses.

5. The method of claim 1, wherein the radiation pattern is generated by carrying out exposure or irradiation beneath a mask.

6. The method of claim 1, wherein the radiation pattern is generated by patterned irradiation of the surface using a temporally and spatially controlled source of radiation.

7. The method of claim 1, wherein the regions of different intensity have an extent of from 0.001 to 10 mm.

8. The method of claim 1, wherein the areal proportion of the regions of relatively high intensity is between 2 and 98% of the surface to be irradiated.

9. The method of claim 1, wherein the patterned irradiation is combined with homogeneous irradiation.

10. The method of claim 7, wherein the areal proportion of the regions of relatively high intensity is between 2 and 98% of the surface to be irradiated.

* * * * *